(12) United States Patent
Wu et al.

(10) Patent No.: US 10,741,257 B1
(45) Date of Patent: Aug. 11, 2020

(54) DYNAMIC BIT LINE VOLTAGE AND SENSING TIME ENHANCED READ FOR DATA RECOVERY

(71) Applicant: SanDisk Technologies LLC, Addison, TX (US)

(72) Inventors: Jianzhi Wu, San Jose, CA (US); Xiang Yang, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/453,291

(22) Filed: Jun. 26, 2019

(51) Int. Cl.
    *G11C 16/04* (2006.01)
    *G11C 16/26* (2006.01)
    *G11C 16/34* (2006.01)
    *G11C 16/24* (2006.01)

(52) U.S. Cl.
    CPC .............. *G11C 16/26* (2013.01); *G11C 16/24* (2013.01); *G11C 16/3404* (2013.01)

(58) Field of Classification Search
    CPC ...... G11C 16/26; G11C 16/24; G11C 16/3404
    USPC ..................................................... 365/185.21
    See application file for complete search history.

(56) References Cited

U.S. PATENT DOCUMENTS

| | | | |
|---|---|---|---|
| 7,772,891 B1 * | 8/2010 | Yang .............. | G01R 31/318533 326/95 |
| 8,724,394 B2 | 5/2014 | Choe et al. | |
| 9,042,175 B2 | 5/2015 | Sim et al. | |
| 2008/0247241 A1 | 10/2008 | Nguyen et al. | |
| 2015/0187414 A1* | 7/2015 | Perner .................. | G11C 13/004 365/148 |
| 2015/0279472 A1 | 10/2015 | Jones | |

OTHER PUBLICATIONS

Sark, et al., "Adaptive Program Verify Scheme for Improving NAND Flash Memory Performance and Lifespan," 2013, IEEE Asian Solid-State Circuits Conference, Nov. 12-14, 2012, Kobe, Japan, pp. 57-60.

* cited by examiner

*Primary Examiner* — Vu A Le
(74) *Attorney, Agent, or Firm* — Dickinson Wright PLLC; Steven Hurles

(57) ABSTRACT

A method and system are provided for reading a non-transitory memory array. When a default read operation is performed and has failed, a dynamic sensing bit line voltage (VBLC) enhanced read or a dynamic sense time read is performed. According to the dynamic VBLC enhanced read or the dynamic sense time enhanced read, the VBLC or the sense time is increased, and a read is performed with the increased VBLC or increased sense time. If this enhanced read is unsuccessful, and if a maximum VBLC or a maximum sense time has not yet been reached, the VBLC or the sense time is increased again, and another read is performed. Once the maximum VBLC or a maximum sense time has been reached, if the read is still not successful, a read failure is reported.

9 Claims, 6 Drawing Sheets

DYNAMIC BIT LINE VOLTAGE AND SENSING TIME ENHANCED READ FOR DATA RECOVERY

BACKGROUND

1. Field

Systems, apparatuses, and methods consistent with exemplary embodiments relate to programming of three dimensional (3D) NAND flash memories, and more specifically dynamic enhanced reading of 3D NAND flash memory devices.

2. Description of the Related Art

3D NAND flash memory is a type of non-volatile flash memory in which memory cells are stacked vertically in multiple layers. 3D NAND was developed to address challenges encountered in scaling two dimensional (2D) NAND technology to achieve higher densities at a lower cost per bit.

A memory cell is an electronic device or component capable of storing electronic information. Non-volatile memory may utilize floating-gate transistors, charge trap transistors, or other transistors as memory cells. The ability to adjust the threshold voltage of a floating-gate transistor or charge trap transistor allows the transistor to act as a non-volatile storage element (i.e. a memory cell), such as a single-level cell (SLC) which stores a single bit of data. In some cases more than one data bit per memory cell can be provided (e.g., in a multi-level cell) by programming and reading multiple threshold voltages or threshold voltage ranges. Such cells include, but are not limited to a multi-level cell (MLC), storing two bits per cell; a triple-level cell (TLC), storing three bits per cell; and a quad-level cell (QLC), storing four bits per cell.

FIG. 1 illustrates a diagram of an exemplary 3D NAND memory 100. The memory 100 includes multiple physical layers that are monolithically formed above a substrate 34, such as a silicon substrate.

Storage elements, for example memory cells 301, are arranged in arrays in the physical layers. A memory cell 301 includes a charge trap structure 44 between a word line 300 and a conductive channel 42. Charge can be injected into or drained from the charge trap structure 44 via biasing of the conductive channel 42 relative to the word line 300. For example, the charge trap structure 44 can include silicon nitride and can be separated from the word line 300 and the conductive channel 42 by a gate dielectric, such as a silicon oxide. An amount of charge in the charge trap structure 44 affects an amount of current through the conductive channel 42 during a read operation of the memory cell 301 and indicates one or more bit values that are stored in the memory cell 301.

The 3D memory 100 includes multiple erase blocks 80. Each block 80 includes a "vertical slice" of the physical layers that includes a stack of word lines 300. Multiple conductive channels 42 (having a substantially vertical orientation, as shown in FIG. 1) extend through the stack of word lines 300. Each conductive channel 42 is coupled to a storage element in each word line 300, forming a NAND string of storage elements, extending along the conductive channel 42. FIG. 1 illustrates three blocks 80, five word lines 300 in each block 80, and three conductive channels 42 in each block 80 for clarity of illustration. However, the 3D memory 100 can have more than three blocks, more than five word lines per block, and more than three conductive channels per block.

A read/write circuitry 68 is coupled to the conductive channels 420 via multiple conductive lines: bit lines, illustrated as a first bit line BL0, a second bit line BL1, and a third bit line BL2 at a first end of the conductive channels (e.g., an end most remote from the substrate 34) and source lines, illustrated as a first source line SL0, a second source line SL1, and a third source line SL2, at a second end of the conductive channels (e.g., an end nearer to or within the substrate 234). The read/write circuitry 68 is illustrated as coupled to the bit lines BL0-BL2 via "P" control lines, coupled to the source lines SL0-SL2 via "M" control lines, and coupled to the word lines 300 via "N" control lines. Each of P, M, and N can have a positive integer value based on the specific configuration of the 3D memory 100.

Each of the conductive channels 42 is coupled, at a first end to a bit line BL, and at a second end to a source line SL. Accordingly, a group of conductive channels 42 can be coupled in series to a particular bit line BL and to different source lines SL.

It is noted that although each conductive channel 42 is illustrated as a single conductive channel, each of the conductive channels 42 can include multiple conductive channels that are in a stack configuration. The multiple conductive channels in a stacked configuration can be coupled by one or more connectors. Furthermore, additional layers and/or transistors (not illustrated) may be included as would be understood by one of skill in the art.

The read/write circuitry 68 facilitates and/or effectuates read and write operations performed on the 3D memory 100. For example, data can be stored to storage elements coupled to a word line 300 and the read/write circuitry 68 can read bit values from the memory cells 301 using one or more sense blocks 36.

The read/write circuitry 68 includes one or more sense blocks 36. The sense blocks 36 are utilized to read or sense one or more values stored in a memory cell 301. In one approach, one sense block 36 is provided for a group of NAND strings, each of which is coupled to a particular bit line BL. Each sense block 36 can include a memory controller (not illustrated in FIG. 1). Each sense block 36 also includes a sense module for each NAND string. Alternatively, a sense block 36 can be coupled to an interval of bit lines, such as even or odd numbered bit lines.

During a read operation, a controller can receive a request from a host device, such as a computer, smartphone, or laptop computer. The controller can cause the read/write circuitry 68 to read bits from particular storage elements of the 3D memory 100 by applying appropriate signals to the control lines to cause storage elements of a selected word line to be sensed. Accordingly, the 3D memory 100 having multiple conductive channels in a stacked configuration can be configured to read from and write data to one or more storage elements.

Memory devices are commonly used in vehicles, and with recent advancements in the field of autonomous cars and other vehicles, a significantly growing number of vehicles generate and need to store large quantities of data. Thus, there is a need for memory devices that can deliver dependable performance even in the types of extreme conditions that many vehicles may be subject to, including wide ambient temperature ranges (e.g. −40° C. up to 125° C.).

SUMMARY

Exemplary embodiments may address at least the above problems and/or disadvantages and other disadvantages not described above. Also, exemplary embodiments are not required to overcome the disadvantages described above, and may not overcome any of the problems described above.

According to an aspect of an exemplary embodiment, a method of reading a non-transitory memory array comprises: performing a default read of a memory array by applying a default sensing bit line voltage (VBLC) and using a default sense time, and, upon determining that the default read is unsuccessful, performing one of a dynamic VBLC enhanced read of the memory array and a dynamic sense time enhanced read of the memory array, The dynamic VBLC enhanced read may comprise: (a) increasing the VBLC, such that $VBLC_i=VBLC_{(i-1)}+\Delta VBLC$, where i is a non-zero integer, (b) performing a read of the memory array using the increased $VBLC_i$; (c) if the read not successful, determining if the $VBLC_i$ has reached a voltage maximum; (d) if the $VBLC_i$ has reached the voltage maximum, reporting a read failure; and (e) if the $VBLC_i$ has not reached the voltage maximum, repeating operations (a)-(e).

The dynamic sense time enhanced read may comprise: (a') increasing the sense time t, such that $t_i=t_{(i-1)}+\Delta t$, where i is a non-zero integer, (b') performing a read of the memory array using the increased sense time t; (c') if the read not successful, determining if the sense time $t_i$ has reached a time maximum; (d') if the sense time $t_i$ has reached the time maximum, reporting a read failure; and (e') if the sense time $t_i$ has not reached the voltage maximum, repeating operations (a')-(e').

The $\Delta VBLC$ may be 50 mV and the $\Delta t$ may be 200 ns.

The voltage maximum may be 300 mV, and the time maximum may be 1200 ns.

According to an aspect of another exemplary embodiment, a non-volatile memory storage system comprises: a memory cell array comprising a plurality of blocks of memory cells; and a dynamic enhanced read circuit configured to perform a default read of the memory cell array by applying a default sensing bit line voltage (VBLC) and using a default sense time, and upon determining that the default read is unsuccessful, perform one of a dynamic VBLC enhanced read of the memory cell array and a dynamic sense time enhanced read of the memory cell array.

According to an aspect of another exemplary embodiment, a non-volatile computer-readable medium is provided having recorded thereon a program which, when executed by a processor, causes the processor to execute a method comprising: performing a default read of a memory array by applying a default sensing bit line voltage (VBLC) and using a default sense time; and upon determining that the default read is unsuccessful, performing one of a dynamic VBLC enhanced read of the memory array and a dynamic sense time enhanced read of the memory array.

BRIEF DESCRIPTION OF THE DRAWINGS

The above and/or other aspects will become apparent and more readily appreciated from the following description of exemplary embodiments, taken in conjunction with the accompanying drawings in which.

DETAILED DESCRIPTION

Figure 1:
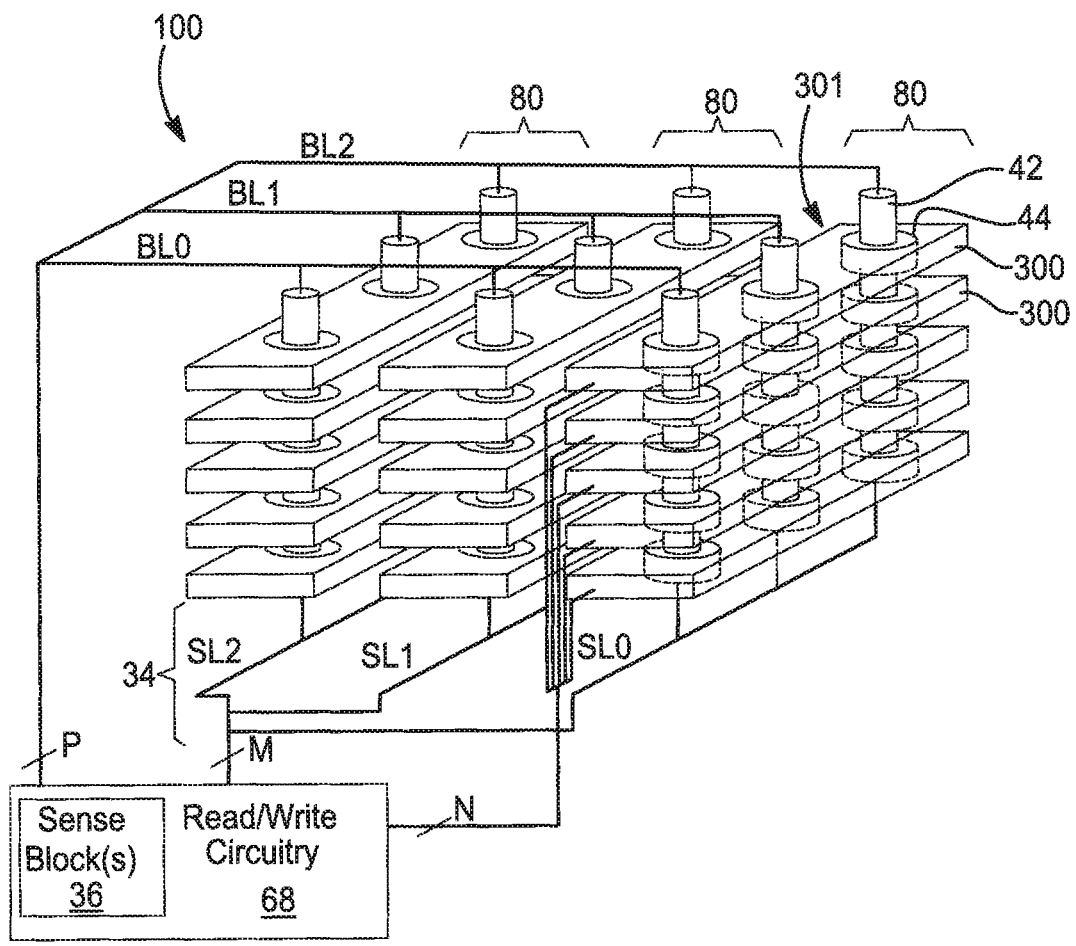
FIG. 1 illustrates a diagram of an exemplary 3D NAND memory.

Reference will now be made in detail to exemplary embodiments which are illustrated in the accompanying drawings, wherein like reference numerals refer to like elements throughout. In this regard, the exemplary embodiments may have different forms and may not be construed as being limited to the descriptions set forth herein.

It will be understood that the terms "include," "including", "comprise, and/or "comprising," when used in this specification, specify the presence of stated features, integers, steps, operations, elements, and/or components, but do not preclude the presence or addition of one or more other features, integers, steps, operations, elements, components, and/or groups thereof.

It will be further understood that, although the terms "first," "second," "third," etc., and "primary," secondary," tertiary," etc., may be used herein to describe various operations, elements, components, regions, layers and/or sections, these operations, elements, components, regions, layers and/or sections may not be limited by these terms. These terms are used only to distinguish one element, component, region, layer or section from another element, component, region, layer or section.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er," "-or," "module," and "unit" described in the specification refer to an element for performing at least one function or operation, and may be implemented in hardware, software, or the combination of hardware and software.

Various terms are used to refer to particular system components. Different companies may refer to a component by different names—this document does not intend to distinguish between components that differ in name but not in function.

A detailed description of matters of these exemplary embodiments that are obvious to those of ordinary skill in the technical field to which these exemplary embodiments pertain may be omitted herefrom.

This description references 3D NAND memory devices. However, it should be understood that the description herein may be likewise applied to other memory devices.

As used herein, the term "memory" denotes semiconductor memory. Types of semiconductor memory include volatile memory and non-volatile memory. Non-volatile memory allows information to be stored and retained even when the non-volatile memory is not connected to a source of power (e.g., a battery). Examples of non-volatile memory include, but are not limited to, flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), spin-transfer torque magnetic random access memory (STT-RAM or STT-MRAM), resistive random access memory (e.g., ReRAM or RRAM) and phase change memory (e.g., PRAM or PCM).

Figure 2:
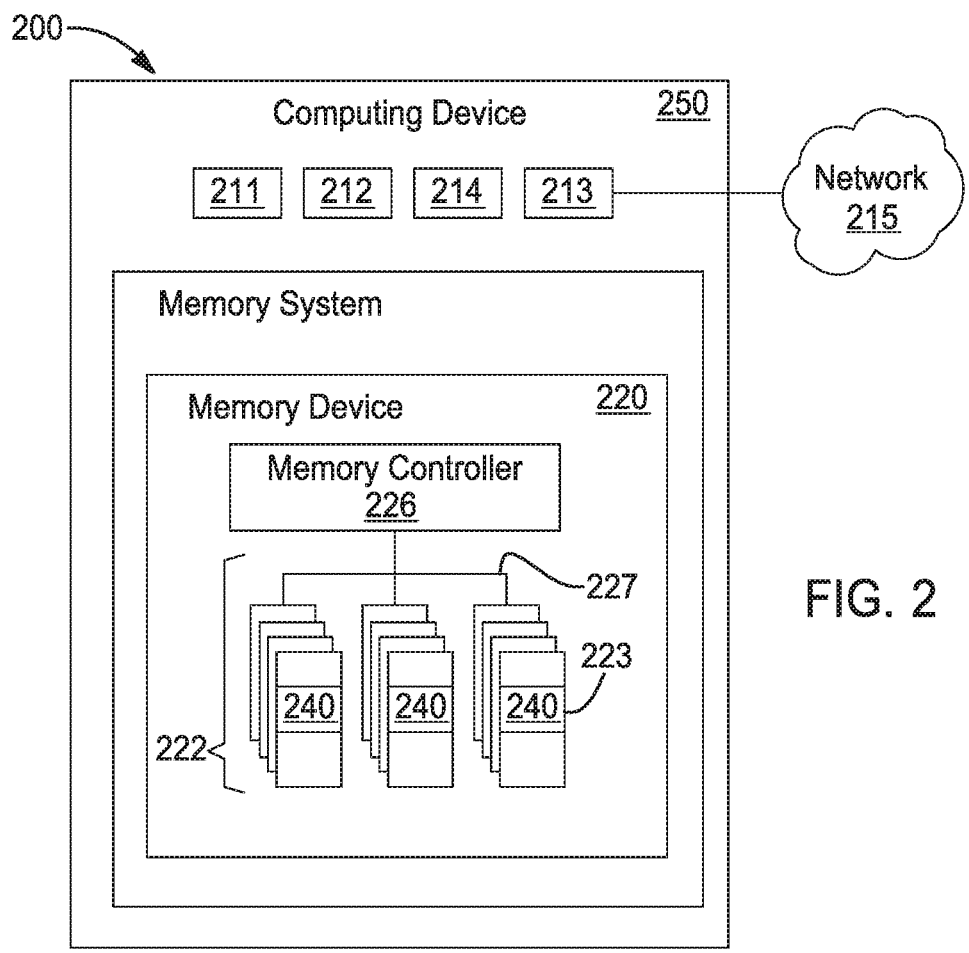
FIG. 2 is a block diagram of a system and a dynamic enhanced read circuit, according to an exemplary embodiment.

FIG. 2 is a block diagram of a system 200 and a dynamic enhanced read circuit 240 for a non-volatile memory device 230 configured to implement the methods of any one or more of the exemplary embodiments described herein, according to an exemplary embodiment. The computing device comprises one or more dynamic enhanced read circuits 240 for memory media 222 of a memory device 230.

The dynamic enhanced read circuit 240 may be a part of and/or in communication with a non-volatile memory media controller 224, a non-volatile memory element 223, a device driver, or the like. The dynamic enhanced read circuit may operate on a non-volatile memory system 220 of a computing device 250, which may comprise a processor 211, a volatile memory 212, and a communication interface 213. For example, the dynamic enhanced read circuit 240 can be disposed at or toward an edge and/or peripheral of a memory element 223, adjacent and/or next to an array of memory media 222. Alternately, the program circuit may be disposed on a different level, layer, and/or plane of an integrated circuit device than an array of memory media 222 (e.g. CMOS or other circuit under the array, parallel with and offset from the array, or the like).

The processor 211 may comprise one or more central processing units, one or more general-purpose processor, one or more application-specific processors, one or more virtual processors (e.g. the computing device 250 may be a virtual machine operating within a host), one or more processor cores, or the like. The communication interface, 213 may comprise one or more network interfaces configured to communicatively couple the computing device 250 and/or non-volatile memory controller 224 to a communication network 215, such as an Internet Protocol (IP) network, a Storage Area network (SAN), wireless network, wired network, or the like.

The non-volatile memory device 230, in various embodiments, may be disposed on one or more different locations relative to the computing device 250. In one exemplary aspect, the non-volatile memory device 230 comprises one or more non-volatile memory elements 223, such as semiconductor chips or packages or other integrated circuit devices disposed on one or more printed circuit boards, storage housings, and/or other mechanical and/or electrical support structures. For example, the non-volatile memory device 230 may comprise one or more direct inline memory module (DIMM) cards, one or more expansion cards and/or daughter cards, a solid-state-drive (SSD) or other hard drive device, and/or may have another memory and/or storage form factor. The non-volatile memory device 230 may be integrated with and/or mounted on a motherboard of the computing device 250, installed in a port and/or slot of the computing device 250, installed on a different computing device 250 and/or a dedicated storage appliance on the network 215, in communication with the computing device 250 over an external bus (e.g. an external hard drive), or the like.

The non-volatile memory device 230, may be disposed on a memory bus of a processor 111 (e.g. on the same memory bus as the volatile memory 212, on a different memory bus from the volatile memory 212, in place of the volatile memory 212, or the like). Alternately, the non-volatile memory device 230 may be disposed on a peripheral bus of the computing device 250, such as a peripheral component interconnect express (PCI Express of PCIe) bus, a Serial Advanced Technology Attachment (SATA) bus, a parallel Advanced Technology Attachment (PATA) bus, a FireWire bus, a Fibre Channel connection, a Universal Serial Bus (USB), a PCIe Advanced Switching (PCIe-AS) bus, or the like. Alternately, the non-volatile memory device 230 may be disposed on a data network 215, such as an Ethernet network, an Infiniband network, SCSI RDMA over a network 215, a storage area network (SAN), a local area network (LAN), a wide area network (WAN) such as the Internet, another wired and/or wireless network 215, or the like.

The computing device 250 may further include a non-transitory, computer-readable storage medium 214. The computer-readable storage medium 214 may comprise executable instructions configured to cause the computing device 250 (e.g. processor 211) to perform operations of one or more of the exemplary methods described herein. Alternatively, or in addition, the dynamic enhanced read circuit 240 may be embodied as one or more computer-readable instructions stored on the non-transitory storage medium 214.

According to various exemplary embodiments, a non-volatile memory controller 224 in communication with one or more dynamic enhanced read circuits 240 may manage one or more non-volatile memory devices 230 and/or non-volatile memory elements 223. The non-volatile memory device(s) 230 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 230). Memory units may include, but are not limited to: pages, memory divisions, blocks, sectors, collections or sets of physical storage locations (e.g., logical pages, logical blocks), or the like.

The non-volatile memory device 230 may comprise one or more elements 223, of non-volatile memory media 222, which may include, but is not limited to: ReRAM, Memresistor memory, programmable metallization cell memory, phase-change memory, (PCM, PCME, PRAM, PCRAM, ovonic unified memory, chalcogenide RAM, or CRAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 223 of non-volatile memory media 222, in certain embodiments, comprise storage class memory (SCM).

While the non-volatile memory media 222 is referred to herein as "memory media," in various embodiments, the non-volatile memory media 222 may more generally comprise one or more non-volatile recording media capable of recording data, which may be referred to as a non-volatile memory medium, a non-volatile storage medium, or the like. Further, the non-volatile memory device 230, in various embodiments, may comprise a non-volatile recording device, a non-volatile memory device, a non-volatile storage device, or the like.

The non-volatile memory media 222 may comprise one or more non-volatile memory elements 223, which may include, but are not limited to: chips, packages, planes, die, or the like. A non-volatile memory media controller 224 may be configured to manage data operations on the non-volatile memory media 222, and may comprise one or more processors, programmable processors (e.g., FPGAs), ASICs, micro-controllers, or the like. In some embodiments, the non-volatile memory media controller 224 is configured to store data on and/or read data from the non-volatile memory media 222, to transfer data to/from the non-volatile memory device 230, and so on.

According to one exemplary embodiment, the non-volatile memory media 222 may comprise one or more 3D NAND memories 100, as discussed above with respect to FIG. 1, as the one or more non-volatile memory elements 223. The dynamic enhanced read circuit 240 may comprise an entirety of or a portion of the read/write circuitry 68 as discussed above with respect to FIG. 1 and may be configured to execute one or more of the methods described herein with respect to the 3D NAND memory 100.

The dynamic enhanced read circuit 240 may comprise logic hardware of one or more non-volatile memory devices 250, such as a non-volatile memory media controller 224, a non-volatile memory element 223, a device controller, a field-programmable gate array (FPGA) or other programmable logic, firmware for an FPGA or other programmable logic, microcode for execution on a microcontroller, an application-specific integrated circuit (ASIC), or the like. The dynamic enhanced read circuit 240 may comprise executable software code, such as a device driv3er or the like, stored on the computer-readable storage medium 214 for execution on the processor 211. The dynamic enhanced read circuit 240 may include a combination of both executable software code and logic hardware.

According to an exemplary embodiment, the dynamic enhanced read circuit 240 may be entirely in one or more components of FIG. 2, and/or partially within one or more components of FIG. 2.

Figure 3:
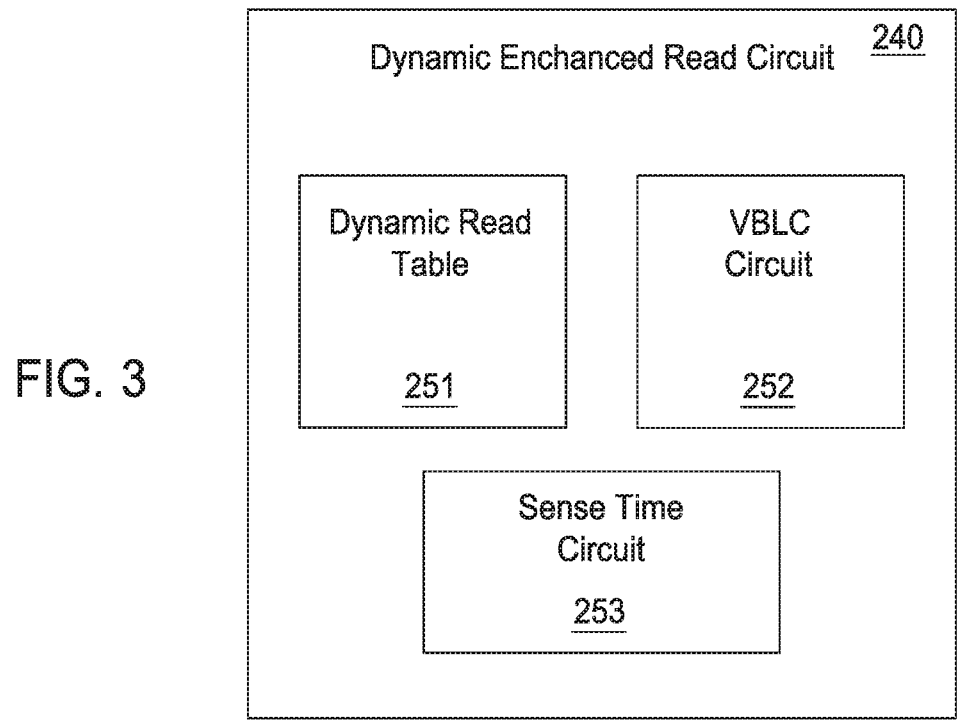
FIG. 3 is a block diagram of the dynamic enhanced read circuit of FIG. 2, according to an exemplary embodiment.

FIG. 3 illustrates a dynamic enhanced read circuit 240 according to an exemplary embodiment.

The dynamic enhanced read circuit 240 may include a dynamic read table 251, a sensing bit line voltage (VBLC) circuit 252, and a sense time circuit 253. In some exemplary embodiments, the dynamic enhanced read circuit may determine a fail bit count (FBC) of a read memory and may determine whether the FBC is higher than a predetermined threshold, as discussed in greater detail below with respect to the methods of FIG. 4 and FIG. 6.

In some exemplary embodiments, the dynamic read table 251 may be used in a dynamic read method as discussed in greater detail below with respect to the method of FIG. 4. The VBLC circuit may determine a VBLC to be applied during a read operation and may control application of the VBLC as discussed in greater detail below with respect to the method of FIG. 4. The sense time circuit 253 may determine a sense time to be used during a read operation and may control the sense time as discussed in greater detail below with respect to the method of FIG. 6.

Dynamic Read

Certain NAND chips exhibit a very high fail bit count (FBA) for a temperature cross-section of about −40° C. to 125° C. when a large sample size is measured. The FBA may be so high that it is beyond the capability of the Error-Correcting Code (ECC), thus resulting in unacceptable reading errors. Specifically, some dies show marginal electric current in the memory cells (I-cell) at extreme conditions (e.g. −40° C.), causing NAND chain cut-off at low temperatures. According to some related art, this issue has been addressed by setting the default sensing bit line voltage (VBLC) or default bit line sensing voltage with temperature coefficient (VBLC_TCO) to a higher value. Unfortunately, a problem with this solution is that the higher VBLC leads to extensively high I-cell for those cells/dies that are not failing, degrading the sub-threshold slope of the cells, leading to more sensing noise.

Additionally, variation among dies must be taken into account. Due to process variation, variations among dies is inevitable. Particularly, with an eye to a slimming target of 6 nm, inevitably, even within a single wafer, some dies will be slimmed by 6.5 nm, while others will be slimmed by 5.5 nm, assuming a process margin of +/−0.5 nm. Therefore, dies that have been slimmed by 5.5 nm will necessarily fare worse than others when faces with larger temperature variations. There is no way that unified/predefined TCO parameters can compensate for this die-to-die variation. Under extreme conditions (e.g. −40° C.), device parameters that have been optimized for 6 nm dies would result in failure of 5.5 nm dies.

One related art solution is called "Dynamic Read" or "optimal read." According to this method, the read level is scanned to determine an optimal point that provides the lowest fail bit count (FBC). However, as this solution only applies to WL biases, if a NAND chain is cut off due to a low channel current, this method does not provide a solution. Furthermore, this method cannot address temperature variations among dies.

Figure 4:
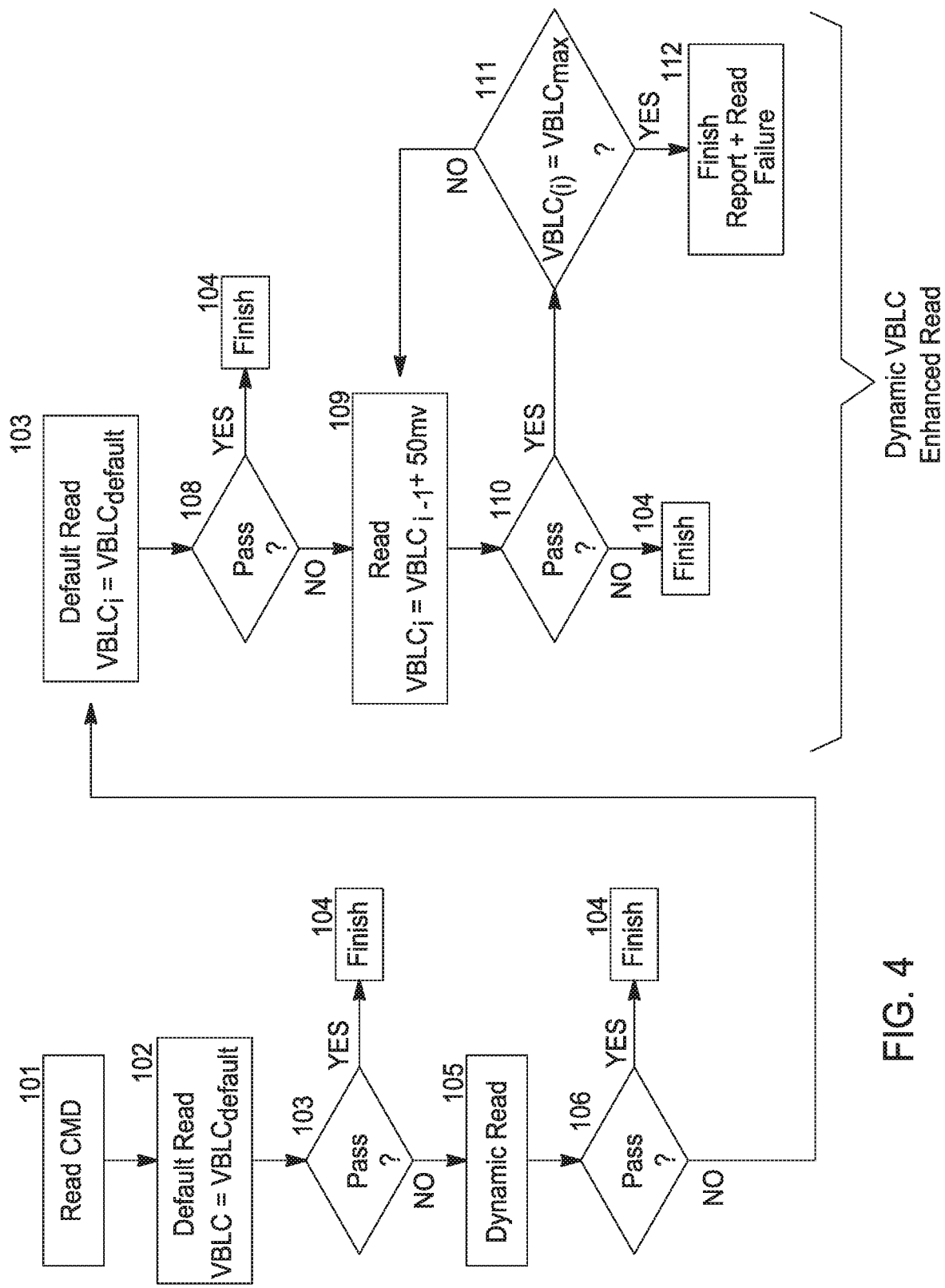
FIG. 4 illustrates a dynamic VBLC enhanced read method according to a first exemplary embodiment.

FIG. 4 illustrates a dynamic VBLC enhanced read method according to a first exemplary embodiment.

As discussed above, related art dynamic read/optimal read solutions may fail to address all issues related to temperature and die variation. One or more exemplary embodiments described herein may provide a read method applying dynamic bit line (BL) voltage and dynamic sense times for data recovery when related art methods have failed, the method providing a boosted channel current. This method may be particularly effective for large temperature variations (e.g. about −40° C. to about 125° C.).

According to the exemplary method of FIG. 4, when a read command is received (101), a standard default read is performed—i.e. a default read mode with VBLC=VBLC$_{default}$ (102). If the default read passes, i.e. a fail bit count (FBC) is higher than a predetermined threshold, (103: YES), the read is finished (104). If the default read fails, i.e. the determined FBC is higher than the predetermined threshold, (103: NO), a dynamic read may be performed—i.e. a dynamic read mode (105). According to a dynamic read mode, as discussed above, the read level is scanned to find an optimal point that provides the lowest FBC. If the dynamic read passes such that the FBC is higher than the predetermined threshold (106: YES), the read is finished (104).

If the dynamic read fails (106: NO), a dynamic VBLC enhanced read is performed—i.e. a dynamic enhanced mode. According to this exemplary embodiment, a dynamic enhanced read includes a series of reads, each including a progressively higher VBLC. With respect to this exemplary embodiment, it is described that the VBLC is increased by 50 mV for each successive read. However, the VBLC may be increased by more or less than 50 mV, as would be understood by one of skill in the art. For example, the VBLC may be increased by 30 mV, 35 mV, 40 mV, 45 mV, 55 mV, 60 mV, or 65 mV, or any other voltage, as would be understood by one of skill in the art. Furthermore, the VBLC may be increased by a varying amount. For example, after a first read, the VBLC may be increased by 50 mV, and after a second read, the VBLC may be increased by 45 mV or by 55 mV. The amount of increase of the VBLC may vary as would be understood by one of skill in the art.

In the dynamic enhanced read mode, a read is first performed at $VBLC_u=VBLC_{default}+50$ mV (107). If the determined FBC is higher than the predetermined threshold, the read passes (108: YES), and the read is finished (104). If the determined FBC is not higher than the predetermined threshold, the read fails (108: NO). A subsequent read is then performed at $VBLC_i=VBLC_{i-1}+50$ mV (109). Here, as noted above, the $VBLC_i$ is increased, with each subsequent read, by 50 mV, for example. However, the VBLC may be increased by more or less than 50 mV as would be understood by one of skill in the art. If the determined FBC is higher than the predetermined threshold, the read passes (110: YES), and the read is finished (104). If the determined FBC is not higher than the predetermined threshold, the read fails (110: NO). At this time, if the VBLC has reached a maximum, for example, if $VBLC_i=300$ mV (111: YES), the read is finished and a read failure is reported (112). In this exemplary embodiment a $VBLC_{max}$ may be 300 mV. However, a predetermined $VBLC_{max}$ may be any voltage, as would be understood by one of skill in the art. If the VBLC has not reached a maximum (111: NO), another read is performed (109), and VBLC is increased.

In this way, the dynamic enhanced read provides a dynamic VBLC, which increases with each subsequent read, to boost the channel current, providing a method of reading after related art methods have failed.

Figure 5:
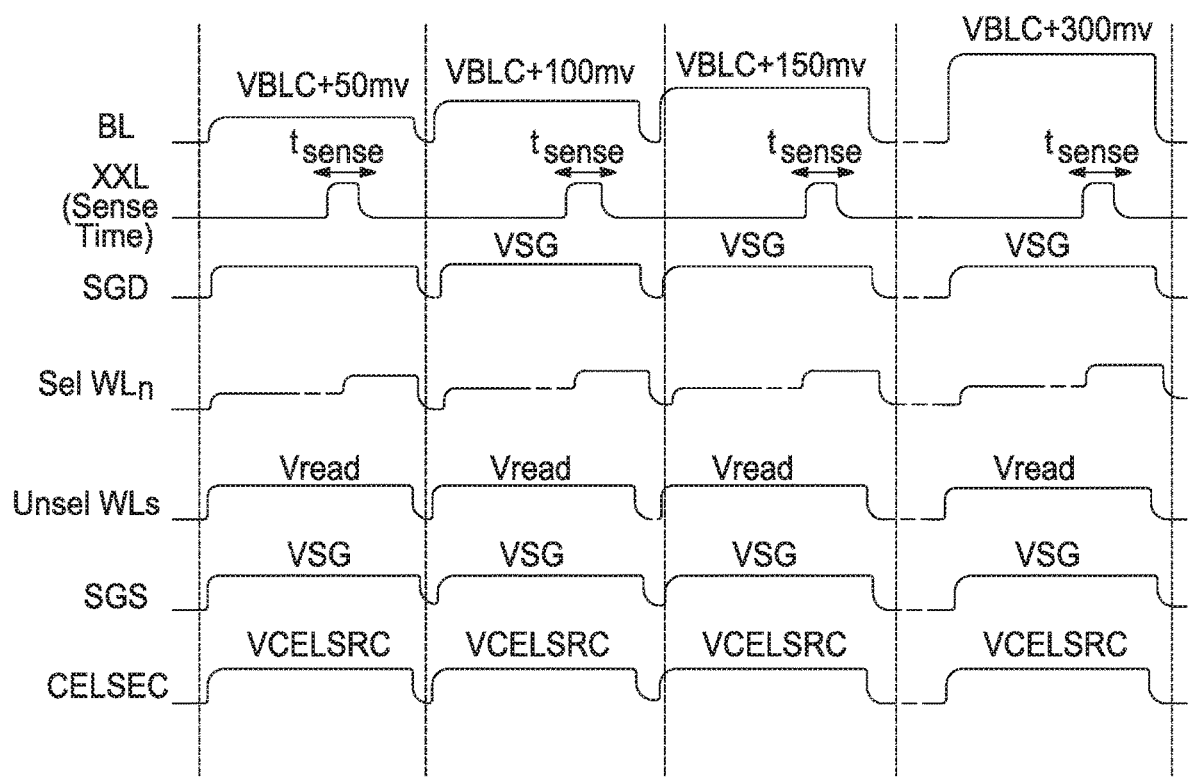
FIG. 5 is a graphic chart illustrating a sensing time and waveforms on a number of lines during a dynamic enhanced read according to the first exemplary embodiment.

FIG. 5 is a graphic chart illustrating a sensing time and waveforms on a number of lines during a dynamic enhanced read according to the first exemplary embodiment.

FIG. 5 illustrates exemplary waveforms on the bit line (BL), the select gate drain (SGD), the selected word line ($WL_n$), the unselected word lines (WLs), the select gate source (SGS), and the common source line (CELSRC), as well as the sense time of the read (XXL Sense Time). As shown, the initial $VBLC_i$ during the dynamic enhanced read is the default VBLC+50 mV. Thereafter, the $VBLC_i$ is progressively increased until the read is successful or until a maximum VBLC is reached.

Figure 6:
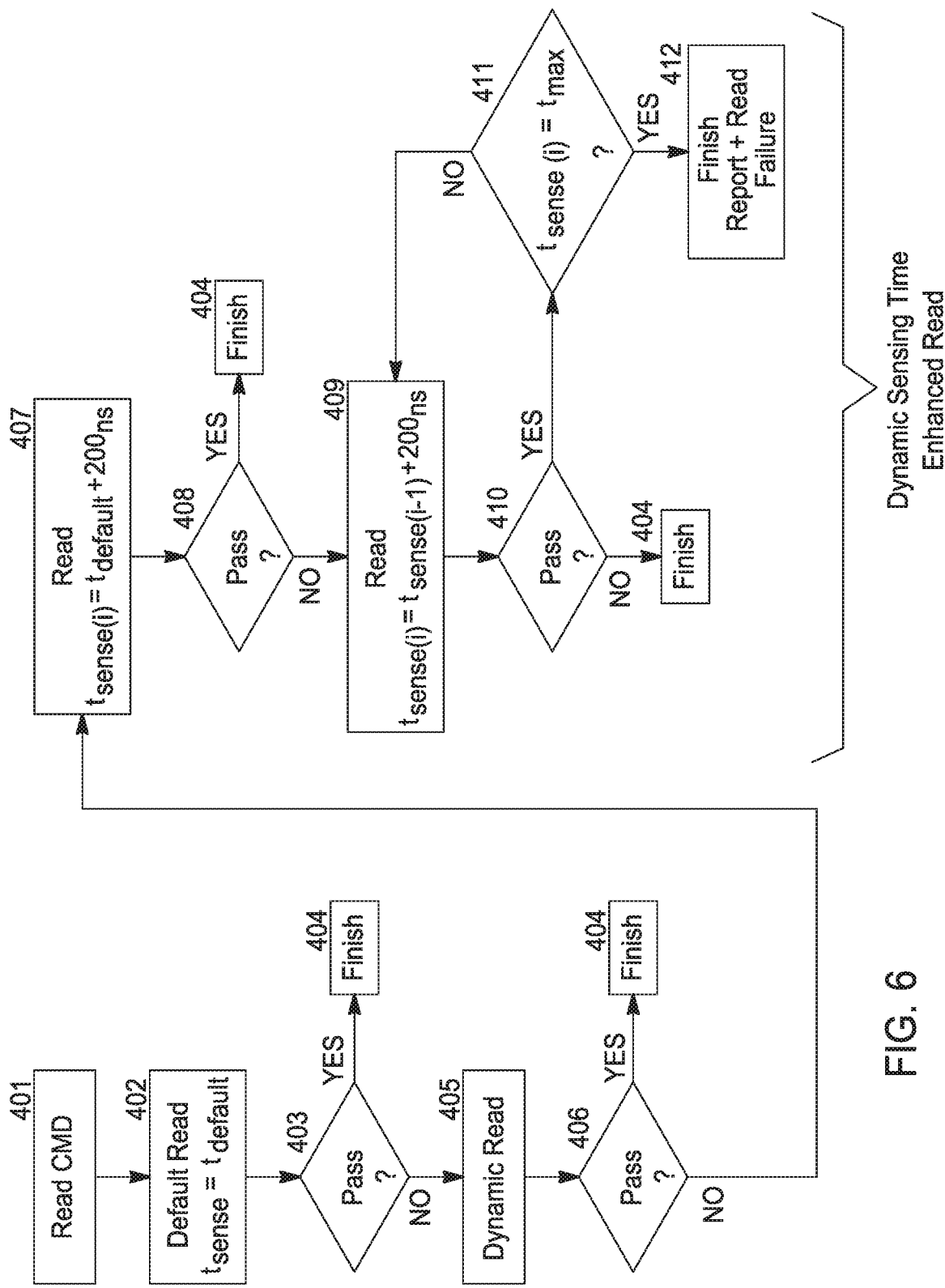
FIG. 6 illustrates a dynamic sensing time enhanced read method according to a second exemplary embodiment.

FIG. 6 illustrates a dynamic sensing time enhanced read method according to a second exemplary embodiment.

According to the exemplary method of FIG. 6, when a read command is received, a default read is performed and, if the default read fails, a dynamic read is performed. These operations (401-406), as shown in FIG. 6 are substantially the same as operations (101-106) as discussed above with respect to FIG. 4. Therefore, a repetitive detailed description is not included here.

If the dynamic read fails (406: NO), a dynamic sensing time enhanced read is performed—i.e. a dynamic enhanced mode. According to this exemplary embodiment, a dynamic enhanced read includes a series of reads, each including a progressively longer sensing time. With respect to this exemplary embodiment, it is described that the sense time is increased by 200 ns for each successive read. However, the sensing time may be increased by more or less than 200 ns, as would be understood by one of skill in the art. For example, $t_{sense}$ may be increased by 50 ns, 100 ns, 150 ns, 250 ns, 300 ns, or 350 ns, or any other amount of time, as would be understood by one of skill in the art. Furthermore, the sensing time may be increased by a varying amount. For example, after a first read, the sensing time may be increased by 200 ns, and after a second read, the sensing time may be increased by 150 ns or by 250 ns. The amount of increase of the sensing time may vary as would be understood by one of skill in the art.

In the dynamic enhanced read mode, a read is first performed with a sensing time of $t_{sense(i)}=t_{default}+200$ ns (407). In other words, the first read performed in the dynamic enhanced read mode is 200 ns longer than the default sense time. If the determined FBC is higher than the predetermined threshold, the read passes (408: YES), and the read is finished (404). If the determined FBC is not higher than the predetermined threshold, the read fails (408: NO). A subsequent read is then performed with a sense time of $t_{sense(i)}=t_{sense(i-1)}+200$ ns (409). Here, as noted above, the sense time $t_{sense(i)}$ is increased, with each subsequent read, by 200 ns, for example. However, the sense time may be increased by more or less than 200 ns as would be understood by one of skill in the art. If the determined FBC is higher than the predetermined threshold, the read passes (410: YES), and the read is finished (404). If the determined FBC is not higher than the predetermined threshold, the read fails (410: NO). At this time, if the sense time $t_{sense(i)}$ has reached a maximum, for example, if $t_{sense(i)}=1200$ ns (411: YES), the read is finished and a read failure is reported (310). In this exemplary embodiment a maximum sense time $t_{max}$ may be 1200 ns. However, a predetermined $t_{max}$ may be any time, as would be understood by one of skill in the art. If the sense time has not reached a maximum (411: NO), another read is performed (409), and the sense time is increased.

In this way, the dynamic enhanced read provides a dynamic sensing time, which increases with each subsequent read, provide time for sensing cells with a slow ramp-up, providing a method of reading after related art methods have failed.

Figure 7:
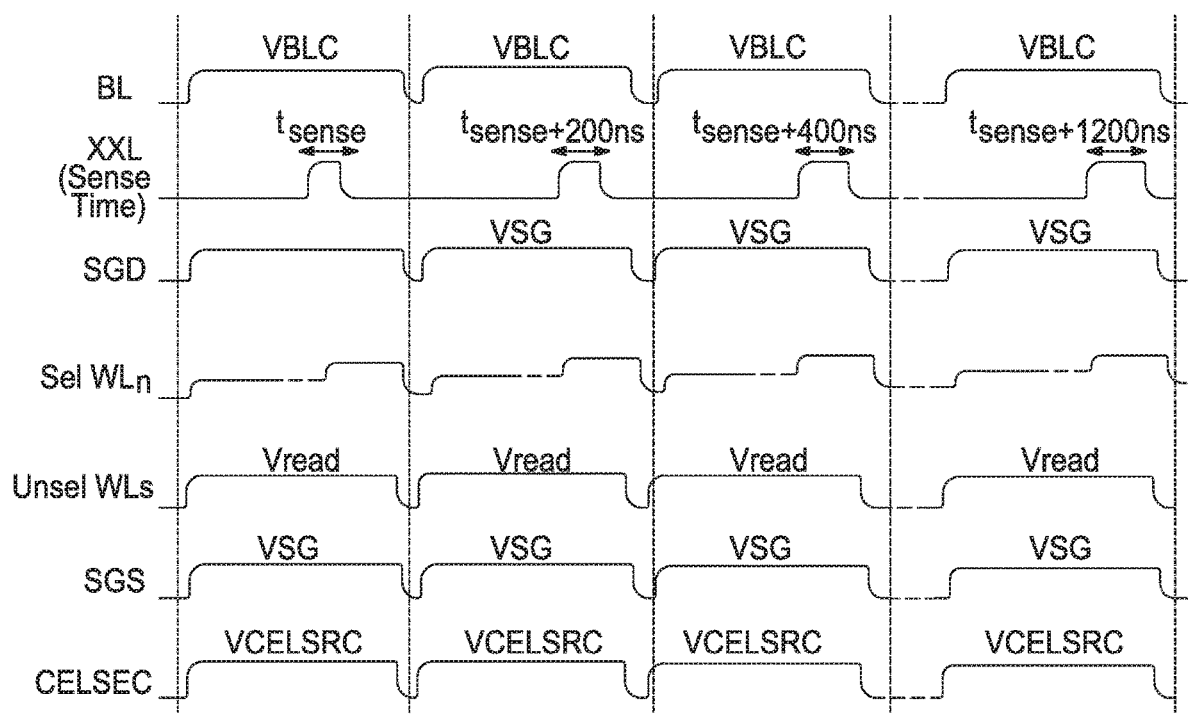
FIG. 7 is a graphic chart illustrating a sensing time and waveforms on a number of lines during a dynamic enhanced read according to the second exemplary embodiment.

FIG. 7 is a graphic chart illustrating a sensing time and waveforms on a number of lines during a dynamic enhanced read according to the second exemplary embodiment.

Like FIG. 5, FIG. 7 illustrates exemplary waveforms on the bit line (BL), the select gate drain (SGD), the selected word line ($WL_n$), the unselected word lines (WLs), the select gate source (SGS), and the common source line (CELSRC), as well as the sense time of the read (XXL Sense Time). As shown, the initial sense time $t_{sense}$ the default sense time ($t_{default}$), is the sense time is progressively increased until the read is successful or until a maximum sense time is reached.

It may be understood that the exemplary embodiments described herein may be considered in a descriptive sense only and not for purposes of limitation. Descriptions of features or aspects within each exemplary embodiment may be considered as available for other similar features or aspects in other exemplary embodiments.

While exemplary embodiments have been described with reference to the figures, it will be understood by those of ordinary skill in the art that various changes in form and details may be made therein without departing from the spirit and scope as defined by the following claims.

What is claimed is:

1. A method of reading a non-transitory memory array, the method comprising:
    performing a default read of a memory array by applying a default sensing bit line voltage (VBLC) and using a default sense time;
    upon determining that the default read is unsuccessful, performing one of a dynamic VBLC enhanced read of the memory array and a dynamic sense time enhanced read of the memory array,
    wherein the dynamic VBLC enhanced read comprises:

(a) increasing the VBLC, such that $VBLC_i = VBLC_{(i-1)} + \Delta VBLC$, where i is a non-zero integer, (b) performing a read of the memory array using the increased $VBLC_i$;

(c) if the read not successful, determining if the $VBLC_i$ has reached a voltage maximum;

(d) if the $VBLC_i$ has reached the voltage maximum, reporting a read failure;

(e) if the $VBLC_i$ has not reached the voltage maximum, repeating operations (a)-(e); and wherein the dynamic sense time enhanced read comprises:

(a') increasing the sense time t, such that $t_i = t_{(i-1)} + \Delta t$, where i is a non-zero integer, (b') performing a read of the memory array using the increased sense time t;

(c') if the read not successful, determining if the sense time $t_i$ has reached a time maximum;

(d') if the sense time $t_i$ has reached the time maximum, reporting a read failure;

(e') if the sense time $t_i$ has not reached the voltage maximum, repeating operations (a')-(e').

2. The method according to claim 1, wherein $\Delta VBLC$ is 50 mV and $\Delta t$ is 200 ns.

3. The method according to claim 1, wherein the voltage maximum is 300 mV, and the time maximum is 1200 ns.

4. A non-volatile memory storage system comprising:

a memory cell array comprising a plurality of blocks of memory cells; and a dynamic enhanced read circuit configured to perform a default read of the memory cell array by applying a default sensing bit line voltage (VBLC) and using a default sense time, and upon determining that the default read is unsuccessful, perform one of a dynamic VBLC enhanced read of the memory cell array and a dynamic sense time enhanced read of the memory cell array, wherein the dynamic VBLC enhanced read comprises:

(a) increasing the VBLC, such that $VBLC_i = VBLC_{(i-1)} + \Delta VBLC$, where i is a non-zero integer, (b) performing a read of the memory array using the increased $VBLC_i$;

(c) if the read not successful, determining if the $VBLC_i$ has reached a voltage maximum;

(d) if the $VBLC_i$ has reached the voltage maximum, reporting a read failure;

(e) if the $VBLC_i$ has not reached the voltage maximum, repeating operations (a)-(e); and wherein the dynamic sense time enhanced read comprises:

(a') increasing the sense time t, such that $t_i = t_{(i-1)} + \Delta t$, where i is a non-zero integer, (b') performing a read of the memory array using the increased sense time t;

(c') if the read not successful, determining if the sense time $t_i$ has reached a time maximum;

(d') if the sense time $t_i$ has reached the time maximum, reporting a read failure;

(e') if the sense time $t_i$ has not reached the voltage maximum, repeating operations (a')-(e').

5. The system according to claim 4, wherein $\Delta VBLC$ is 50 mV and $\Delta t$ is 200 ns.

6. The system according to claim 4, wherein the voltage maximum is 300 mV, and the time maximum is 1200 ns.

7. A non-volatile computer-readable medium having recorded thereon a program which, when executed by a processor, causes the processor to execute a method comprising:

performing a default read of a memory array by applying a default sensing bit line voltage (VBLC) and using a default sense time;

upon determining that the default read is unsuccessful, performing one of a dynamic VBLC enhanced read of the memory array and a dynamic sense time enhanced read of the memory array, wherein the dynamic VBLC enhanced read comprises:

(a) increasing the VBLC, such that $VBLC_i = VBLC_{(i-1)} + \Delta VBLC$, where i is a non-zero integer, (b) performing a read of the memory array using the increased $VBLC_i$;

(c) if the read not successful, determining if the $VBLC_i$ has reached a voltage maximum;

(d) if the $VBLC_i$ has reached the voltage maximum, reporting a read failure;

(e) if the $VBLC_i$ has not reached the voltage maximum, repeating operations (a)-(e); and wherein the dynamic sense time enhanced read comprises:

(a') increasing the sense time t, such that $t_i = t_{(i-1)} + \Delta t$, where i is a non-zero integer, (b') performing a read of the memory array using the increased sense time $t_i$;

(c') if the read not successful, determining if the sense time $t_i$ has reached a time maximum;

(d') if the sense time $t_i$ has reached the time maximum, reporting a read failure;

(e') if the sense time $t_i$ has not reached the voltage maximum, repeating operations (a')-(e').

8. The non-volatile computer-readable medium according to claim 7, wherein $\Delta VBLC$ is 50 mV and $\Delta t$ is 200 ns.

9. The non-volatile computer-readable medium according to claim 7, wherein the voltage maximum is 300 mV, and the time maximum is 1200 ns.

* * * * *